United States Patent [19]
Rasinski et al.

[11] Patent Number: 5,731,653
[45] Date of Patent: Mar. 24, 1998

[54] LOW RESISTANCE CURRENT TRANSFER DEVICE FOR A CIRCUIT OF A BRUSHLESS EXCITER

[75] Inventors: Michael Joseph Rasinski, Winter Springs; Robert Ervin Ashley, III, Oviedo, both of Fla.

[73] Assignee: Westinghouse Electric Corporation, Pittsburgh, Pa.

[21] Appl. No.: 734,377

[22] Filed: Oct. 17, 1996

[51] Int. Cl.$^6$ ................................................. H02K 11/00
[52] U.S. Cl. ........................ 310/680; 310/72; 361/20; 361/23
[58] Field of Search ......................... 310/68 D, 682, 310/72; 361/20, 23

[56] References Cited

U.S. PATENT DOCUMENTS

| | | |
|---|---|---|
| 3,590,291 | 6/1971 | Spisak et al. .................. 310/68 D |
| 3,686,523 | 8/1972 | Gordon et al. ...................... 310/72 |
| 3,723,794 | 3/1973 | Spisak et al. .................. 310/68 D |
| 3,829,725 | 8/1974 | Petersen et al. .............. 310/68 D |
| 3,872,335 | 3/1975 | Petersen et al. .............. 310/68 D |
| 4,007,389 | 2/1977 | Kuter ............................. 310/68 D |
| 4,048,532 | 9/1977 | Kuter et al. .................... 310/68 D |
| 4,052,629 | 10/1977 | Kuter et al. .................... 310/68 D |
| 5,093,597 | 3/1992 | Hughes .......................... 310/209 |
| 5,227,942 | 7/1993 | Rourk ............................... 361/20 |

Primary Examiner—Steven L. Stephan
Assistant Examiner—Michael J. Wallace, Jr.

[57] ABSTRACT

A brushless exciter diode wheel system includes a diode wheel and an electrical connection apparatus that is coupled to the diode wheel. The electrical connection apparatus includes a fuse support block, a diode support block, and a connector for electrically connecting the fuse support block to the diode support block. This connector permits the system to carry at least about 2000 amps of current, which is far in excess of the current capacity of conventional systems of this configuration.

19 Claims, 1 Drawing Sheet

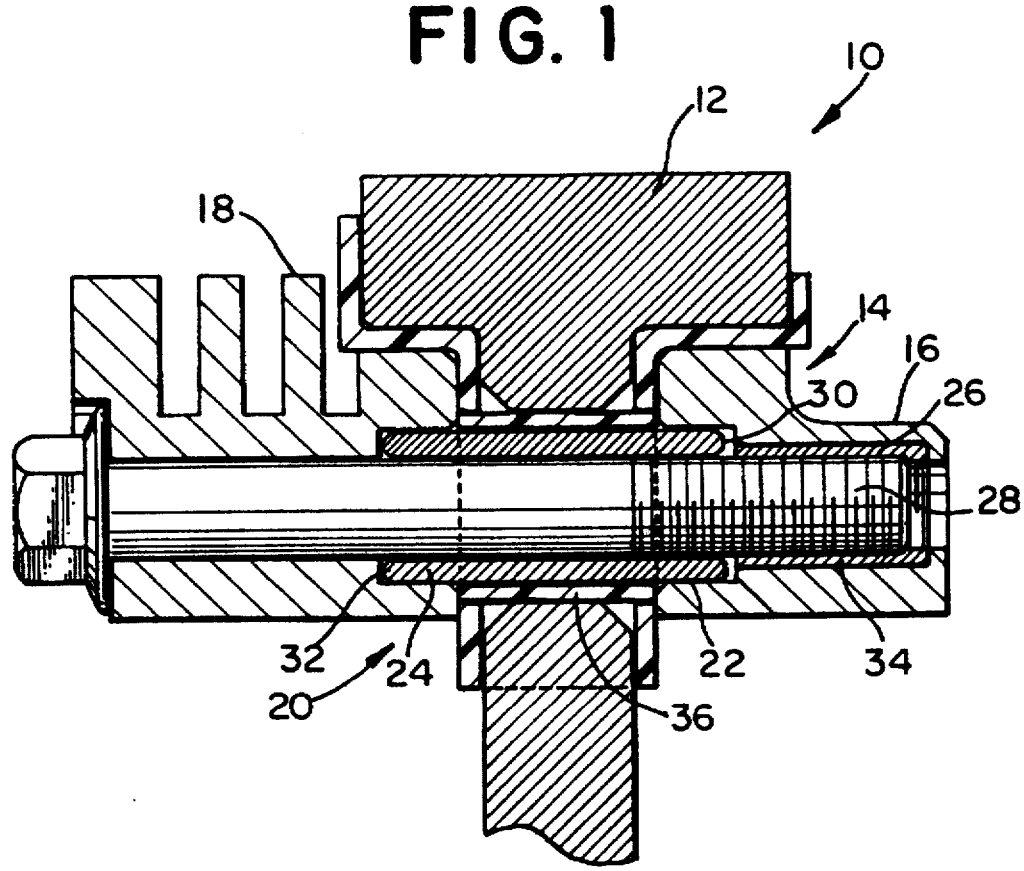

LOW RESISTANCE CURRENT TRANSFER DEVICE FOR A CIRCUIT OF A BRUSHLESS EXCITER

BACKGROUND OF THE INVENTION

1. Field of the Invention

This invention relates to electrical connecting components of an exciter for a turbine generator. More specifically, this invention relates to an electrical connecting means capable of carrying a higher current than conventional brushless exciter diode wheel systems of this configuration.

2. Description of the Prior Art

A brushless exciter diode wheel of a turbine generator supplies the field current necessary to generate electrical power. In order to design a turbine generator capable of producing a greater power output, an exciter must be capable of supplying a larger field current. The design parameters of new electrical generators require an exciter to support a field current of at least about 2000 amps. Unfortunately, conventional exciters of this configuration are rated at about 1000 amps. Without an exciter capable of conducting this higher current, the electrical power that a turbine generator can produce is limited.

One aspect of an exciter that must support a higher current is the rectifier assembly. More specifically, the electrical connection between a diode support and a fuse support of a brushless exciter diode wheel of a rectifier assembly must be capable of supporting a higher current. Due to design requirements of the exciter, the fuse support and the diode support are located on opposite sides of a diode wheel and connected mechanically by bolts. Previously, these bolts also provided the electrical connection between the fuse and diode supports. Since the main function of the bolt is to fasten the diode support structure to the fuse support structure, it must possess relatively high mechanical strength. However, since it possess relatively high mechanical strength, it has poor electrical conductance properties. Unfortunately, in previous designs this poor electrical conductance of the bolt limited the rectifying circuit to carrying about 1000 amps. Without a means to connect the fuse and diode supports electrically at a current of at least about 2000 amps within the design constraint that the diode and fuse support be located on opposite sides of a diode wheel, turbine generators with greater power outputs could not be produced.

Thus, it is clear that there has existed a long and unfulfilled need in the prior art for a system which provides an electrical connection between a fuse support and a diode support of a turbine generator brushless exciter diode wheel capable of conducting at least about 2000 amps.

SUMMARY OF THE INVENTION

Accordingly, it is an object of the invention to provide a system which has an electrical connection between a fuse support and a diode support of a turbine generator brushless exciter diode wheel that is capable of conducting at least about 2000 amps.

In order to achieve the above and other objects of the invention, an electrical connection apparatus for a brushless exciter diode wheel system includes, according to a first aspect of the invention, a fuse support block; a diode support block; and a connecting structure for electrically connecting the fuse support block to the diode support block, the electrical connecting structure being capable of carrying at least about 2000 amps.

According to a second aspect of the invention, an electrical connection apparatus for a brushless exciter diode wheel system of the type that has a fuse support block and a diode support block, includes a connecting structure for electrically connecting the fuse support block to the diode support block, and a fastening structure for mechanically fastening and electrically connecting the fuse support block to the diode support block, such that the connecting and the fastening structures are capable of carrying at least about 2000 amps of current between the diode support block and the fuse support block.

According to a third aspect of the invention, a brushless exciter diode wheel system includes a diode wheel; and an electrical connection apparatus coupled to the diode wheel, the electrical connection apparatus having a fuse support block, a diode support block, and a connecting structure for electrically connecting the fuse support block to the diode support block, such that the electrical connecting structure is capable of carrying at least about 2000 amps of current.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 1 is a diagrammatical view of a low resistant current transfer device for a circuit of a brushless exciter that is constructed according to a preferred embodiment of the invention.

DETAILED DESCRIPTION OF THE PREFERRED EMBODIMENTS

Referring now to the drawing, an improved brushless exciter diode wheel system 10 that is constructed according to a preferred embodiment of the invention includes a diode wheel 12, and an electrical connection apparatus 14 that is coupled to the diode wheel 12. The electrical connection apparatus 14 is coupled to the diode wheel 12 by circumferentially mounting the electrical connection apparatus 14 around the diode wheel 12 with a bolt 28.

As may be seen in FIG. 1, the electrical connection apparatus 14 includes a fuse support block 16, a diode support block 18 and an improved connection structure 20 for electrically connecting the fuse support block 16 to the diode support block 18. According to one important facet of the invention, the connection structure 20 is constructed and arranged so as to be capable of carrying at least about 2000 amps of current, which is substantially in excess of the current carrying capacity of such systems heretofore known. Fuse support block 16 and diode support block 18 are of conventional construction.

Referring again to FIG. 1, it will be seen that the connection structure 20 includes a first connector 22 for electrically connecting the fuse support block 16 to the diode support block 18. A second connector 26, which is arranged so as to be in electrical parallel with the first connector 22, also electrically connects the fuse support block 16 to the diode support block 18. As may been seen in FIG. 1, the first connector 22 is preferably embodied as a cylinder member 24 having an outer surface that is mechanically supported by an insulator 36, which in turn is mechanically supported by a diode wheel 12. Cylinder member 24 is preferably fabricated from a material having low electrical resistance and low density, most preferably aluminum. It preferably includes a fuse end 30 that is in electrical connection in fuse support block 16, and a diode end 32 that is in electrical connection with the diode support block 18, as may be seen in FIG. 1. Preferably, both the fuse end 30 and the diode end 32 are slightly tapered to avoid wear and damage, and to provide self-centering when assembled with the fuse and diode blocks.

Second connector 26 includes a fastening mechanism for mechanically fastening the fuse support block 16 to the diode support block 18. In the preferred embodiment, second connector 26 is embodied as a fastener 34, which is preferably a bolt. As a result of the mechanical strength requirements of the fastener 34, bolt 28 is fabricated from a material that has a higher electrical resistance than that of the cylinder member 24 of the first connector 22. In other words, the cylinder member 24, which is mounted circumferentially around the second connector 26, has a lower electrical resistance than that of the fastener 34 that is embodied by the bolt 28.

The first connector 22 is preferably fabricated with an interference fit that provides sufficient resistance to thermal expansion. By having a sufficient resistance to thermal expansion, the movement of the first connector 22 relative to the other components of the system 10 is minimized. This also reduces wear on the electrical points of contact, the fuse end 30 and the diode end 32 of the cylinder 24.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

We claim:

1. An electrical connection apparatus for a brushless exciter system, said apparatus comprising:

a diode wheel;

a fuse support block;

a diode support block, said fuse support block and said diode support block being mounted on opposite sides of said diode wheel; and a connecting means for electrically connecting said fuse support block to said diode support block, said electrical connecting means including a first means for electrically connecting said fuse support block to said diode support block and a second means for electrically connecting said fuse support block to said diode support block, said second means being arranged in electrical parallel with said first means, wherein said second means further comprises a fastening means for mechanically fastening said fuse support block to said diode support block and wherein said first means has a lower electrical resistance than that of said fastening means.

2. The apparatus as described in claim 1, wherein said connecting means is capable of carrying at least 2000 amps of current.

3. The apparatus as described in claim 1, further comprising insulation positioned between said diode wheel and said first means for electrically connecting said fuse support block to said diode support block.

4. The apparatus as described in claim 1, wherein said fastening means comprises a bolt.

5. The apparatus as described in claim 1, wherein said first means comprises a cylinder circumferentially mounted around said second means, said cylinder having a fuse end that is electrically connected to said fuse support block and a diode end that is electrically connected to said diode support block.

6. The apparatus as described in claim 5, wherein said cylinder member further comprises aluminum.

7. The apparatus as described in claim 5, wherein said fust end further comprises a tapered fuse end and said diode end further comprises a tapered diode end.

8. An electrical connection apparatus for a brushless exciter, said apparatus comprising:

a diode wheel;

a fuse support block;

a diode support block, said fuse support block and said diode support block being mounted on opposite sides of said diode wheel; and a connecting means for electrically connecting said fuse support block to said diode support block;

a fastening means for mechanically fastening and electrically connecting said fuse support block to said diode support block;

wherein said connecting means comprises a cylinder circumferentially mounted around said fastening means, said cylinder having a fuse end that is electrically connected to said fuse support block and a diode end that is electrically connected to said diode support block.

9. The apparatus as described in claim 8, wherein said connecting means and said fastening means are capable of carrying at least 2000 amps of current.

10. The apparatus as described in claim 8, wherein said connecting means has a electrical resistance lower than that of said fastening means.

11. The apparatus as described in claim 8, further comprising insulation between said connecting means and said diode wheel.

12. The apparatus as described in claim 8, wherein said cylinder further comprises aluminum.

13. The apparatus as described in claim 8, wherein said fuse end further comprises a curved fuse end and said diode end further comprises a curved diode end.

14. A brushless exciter diode wheel system, comprising:

a diode wheel; and an electrical connection apparatus coupled to said diode wheel and said electrical connection apparatus comprising a fuse support block, a diode support block, and a connecting means for electrically connecting said fuse support block to said diode support block, said fuse support block and said diode support block being positioned on opposite sides of said diode wheel and said connecting means being insulated from said diode wheel;

wherein said connecting means comprises a cylinder, said cylinder having a fuse end that is electrically connected to said fuse support block and a diode end that is electrically connected to said diode support block.

15. The apparatus as described in claim 14, wherein said connecting means further comprises a fastening means for electrically connecting said fuse support block to said diode support block, said cylinder being arranged in electrical parallel with said fastening means.

16. The apparatus as described in claim 14, wherein said connecting means is capable of carrying at least about 2000 amps of current.

17. The apparatus as described in claim 15, wherein said cylinder has a lower electrical resistance than that of said fastening means.

18. The apparatus as described in claim 15, wherein said fastening means comprises a bolt.

19. The apparatus as described in claim 14, wherein said cylinder is circumferentially mounted around said fastening means.

* * * * *